United States Patent [19]
Kwa

[11] Patent Number: 5,187,713
[45] Date of Patent: Feb. 16, 1993

[54] NONLINEAR DEVICE CONTROL METHODS AND APPARATUS

[75] Inventor: Peter T. H. Kwa, Kanata, Canada

[73] Assignee: Northern Telecom Limited, Montreal, Canada

[21] Appl. No.: 827,307

[22] Filed: Jan. 30, 1992

[51] Int. Cl.⁵ ............................................. H01S 3/10
[52] U.S. Cl. ...................................... 372/26; 372/38; 372/29
[58] Field of Search ................... 372/26, 29, 38, 31, 372/32

[56] References Cited

U.S. PATENT DOCUMENTS

| | | | |
|---|---|---|---|
| 4,081,670 | 3/1978 | Albanese | 372/29 |
| 4,385,387 | 5/1983 | Trimmel | 372/26 |
| 4,504,975 | 3/1985 | Beaudet . | |
| 4,698,817 | 10/1987 | Burley | 372/31 |
| 4,995,045 | 2/1991 | Burley et al. | 372/38 |
| 5,018,154 | 5/1991 | Ohashi | 372/29 |
| 5,025,447 | 6/1991 | Ohashi | 372/31 |
| 5,049,769 | 5/1991 | Levinson | 372/29 |

*Primary Examiner*—Léon Scott, Jr.
*Attorney, Agent, or Firm*—C. W. Junkin

[57] ABSTRACT

In methods and apparatus for controlling the D.C. bias point of a nonlinear device, asymmetric envelope modulation is applied to an input signal, and the nonlinear device is driven by the asymmetric envelope-modulated signal and a D.C. bias signal. A nonlinear characteristic of the device is monitored at the modulation frequency, and the D.C. bias signal is controlled in response to the monitored characteristic so as to reduce the monitored characteristic at the modulation frequency. The methods and apparatus are particularly useful for controlling the D.C. bias point of semiconductor diode lasers, in which case the monitored characteristic can be the light output of the laser or the voltage across the laser.

21 Claims, 6 Drawing Sheets

NONLINEAR DEVICE CONTROL METHODS AND APPARATUS

FIELD OF THE INVENTION

This invention relates generally to methods and apparatus for controlling nonlinear devices, and more particularly to methods and apparatus for controlling the D.C. bias point of nonlinear devices such as semiconductor diode lasers.

BACKGROUND OF THE INVENTION

The light output of a semiconductor diode laser is nonlinear with respect to applied drive current. In particular, diode lasers emit a limited amount of light by spontaneous emission when driven by currents below a threshold current, and emit considerably more light by stimulated emission when driven by currents above the threshold current. Moreover, the dependence of light output on drive current is greater for drive currents above the threshold current than for drive currents below the threshold current.

The voltage characteristic of a semiconductor diode laser is also nonlinear with respect to applied drive current. In particular, the voltage across the diode laser saturates for currents above the threshold current.

When used as light sources for optical communications, diode lasers are driven by a signal current combined with a D.C. bias current. The D.C. bias current is selected to optimize the operation of the diode laser for the particular type of signal to be transmitted. For transmission of analogue signals, the D.C. bias current should exceed the threshold current so that the diode laser operates in the most linear region of its light output characteristic, avoiding signal distortion due to the nonlinearity in the light output characteristic around the threshold current. For transmission of digital signals, the D.C. bias current should be near the threshold current so that the nonlinearity of the light output characteristic improves the extinction ratio of the transmitted signal. However, the D.C. bias current cannot be made too much smaller than the threshold current without increasing the time required to turn the diode laser on, and thereby limiting its operation for transmission of high bit rate signals.

Light output characteristics for diode lasers vary with operating temperature and as the diode lasers age. Consequently, the D.C. bias current that should be applied to a diode laser for a particular mode of operation varies with the operating temperature and age of the diode laser. Adaptive control circuits have been developed to sense changes in the operating characteristics of diode lasers and, in response to the sensed changes, to control the D.C. bias current.

Many known adaptive control circuits for controlling the D.C. bias currents of diode lasers sense light output of the diode lasers with back facet monitors, derive voltages which are proportional to the average optical output power of the diode lasers, and adjust the D.C. bias currents to minimize the difference between those voltages and appropriate reference voltages. (See for example U.S. Pat. No. 4,698,817 issued in the name of G. S. Burley on Oct. 6, 1987 and entitled Peak Optical Power Control Circuit for Laser Driver.) Some such diode laser control circuits apply a pilot tone to the bias current and use a resulting pilot tone component of the sensed light output of the diode laser to control a magnitude of a signal current used to modulate the laser. (See for example U.S. Pat. No. 4,504,976 issued in the name of D. Beaudet on Mar. 12, 1985; U.S. Pat. No. 4,995.045 issued in the names of G. S. Burley et al on Feb. 19, 1991; and Japanese Patent Document 60-91687 published in the name of Y. Ogura on May 23, 1985.)

U.S. Pat. No. 4,385,387 discloses a diode laser control circuit which applies a pilot tone to the bias current, senses the light output of the diode laser, and passes the resulting signal through a high pass filter to eliminate low frequency components of the resulting signal. Clipping of the diode laser light output at the threshold current appears in the filtered signal as a reduction in the signal amplitude. The D.C. bias current is adjusted to produce a desired duration of clipping of the diode laser light output which corresponds to a desired relationship between the D.C. bias current and the threshold current. (U.S. Pat. No. 4,385,387 issued in the name of H. Trimmel on May 24, 1983 and is entitled Preconduction Current Control of Diode Lasers.)

In a typical optical fiber communications system, an optical signal is coupled from a diode laser to an optical fiber, and the optical signal is coupled from the optical fiber to a high impedance optical receiver at a remote location. Unfortunately, the pilot tone which is applied to the bias current in some known diode laser control circuits is injected into the fiber as part of the optical signal and can saturate the high impedance optical receiver, adversely affecting the operation of the optical communications system.

U.S. Pat. No. 4,081,670 discloses an adaptive control circuit for biasing a diode laser above threshold for linear operation suitable for transmitting analogue signals. The disclosed control circuit senses an A.C. component of a signal voltage across the diode laser and adjusts the D.C. bias current to minimize the A.C. component of the sensed voltage. (U.S. Pat. No. 4,081,670 issued Mar. 28, 1978 in the name of A. Albanese and is entitled Automatic Bias Control Circuit for Injection Lasers.)

SUMMARY OF INVENTION

This invention provides novel methods and apparatus for controlling a D.C. bias point of a nonlinear device such as a semiconductor diode laser.

One aspect of the invention provides a method for controlling a D.C. bias point Of a nonlinear device. The method comprises:

applying asymmetric envelope modulation at a modulation frequency to an input signal to derive an asymmetric envelope-modulated signal;

adding a D.C. bias signal to the asymmetric envelope-modulated signal to derive a drive signal; and driving a nonlinear device with the drive signal, while;

monitoring at the modulation frequency a characteristic of the nonlinear device which is nonlinear with respect to the drive signal; and controlling the D.C. bias signal in response to the monitored characteristic so as to reduce the monitored characteristic at the modulation frequency.

Where the nonlinear device is a semiconductor diode laser, the step of applying asymmetric envelope modulation and adding a D.C. bias signal may provide a laser drive signal having a modulation envelope characterized by variations in maximum drive current of greater magnitude than variations in minimum drive current, and the step of monitoring at the modulation frequency a characteristic of the laser which is nonlinear with respect to the laser drive signal may comprise monitoring a component at the modulation frequency of a voltage across a junction of the diode laser.

Alternatively, the steps of applying asymmetric envelope modulation and adding a D.C. bias signal may provide a laser drive signal having a modulation envelope characterized by variations in minimum drive current of greater magnitude than variations in maximum drive current, and the step of monitoring at the modulation frequency a characteristic of the laser which is nonlinear with respect to the laser drive signal may comprise monitoring a component at the modulation frequency of light output of the diode laser.

Another aspect of the invention provides apparatus for controlling a D.C. bias point of a nonlinear device. The apparatus comprises:

an asymmetric envelope modulator for applying asymmetric envelope modulation at a modulation frequency to an input signal to derive an asymmetric envelope-modulated signal;

a D.C. bias signal source for adding a D.C. bias signal to the asymmetric envelope-modulated signal to derive a drive signal for driving the nonlinear device; and a monitor for monitoring at the modulation frequency a characteristic of the nonlinear device which is nonlinear with respect to the drive signal;

the D.C. bias signal source being responsive to the monitored characteristic at the modulation frequency to adjust the D.C. bias signal so as to reduce the monitored characteristic at the modulation frequency.

BRIEF DESCRIPTION OF ACCOMPANYING DRAWINGS

Embodiments of the invention are described below by way of example only. Reference is made to accompanying drawings, in which.

DETAILED DESCRIPTION OF EMBODIMENTS

Figure 1:
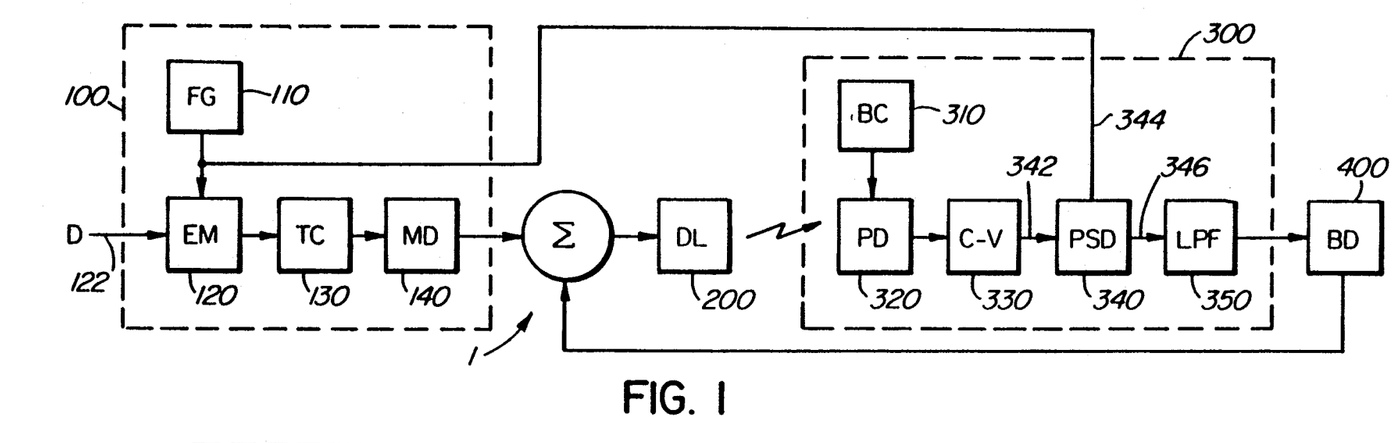
FIG. 1 is a block schematic diagram of a semiconductor diode laser control circuit according to a first embodiment of the invention.

FIG. 1 is a block schematic diagram of a semiconductor diode laser control circuit 1 according to a first embodiment of the invention. The laser control circuit 1 comprises an asymmetric envelope modulator 100 comprising a frequency generator 110, a symmetric envelope modulator 120, a top-clipping circuit 130 and a modulation current driver circuit 140. The frequency generator 110 supplies a signal at a modulation frequency to the symmetric envelope modulator 120. The symmetric envelope modulator 120 applies symmetric envelope modulation at the modulation frequency to an incoming data signal received on a data terminal 122 to derive a symmetric envelope-modulated signal. The top-clipping circuit 130 clips the symmetric envelope-modulated signal at a maximum signal value to derive an asymmetric envelope-modulated signal. The asymmetric envelope-modulated signal is fed to the modulation current driver circuit 140 which provides current drive and impedance matching as required for driving a semiconductor diode laser 200 with the asymmetric envelope-modulated signal.

The laser control circuit 1 further comprises an optical receiver 300 which comprises a photodetector bias circuit 310, a low speed photodetector 320, a current-to-voltage converter 330, a phase-sensitive detector 340 and a low pass filter 350. The photodetector 320 is positioned to receive light from a back facet of the diode laser 200, and is biased by the photodetector bias circuit 310 to provide a photocurrent indicative of the light received from the laser 200. Because the photodetector 200 has poor high frequency response, the photocurrent waveform includes only relatively low frequency components of the light output waveform emitted by the laser 200, including components at the frequency of envelope modulation, but excluding components at the frequency of the incoming data signal. The current-to-voltage converter 330 converts the photocurrent to a voltage signal which is applied to a first input 342 of the phase-sensitive detector 340. The phase-sensitive detector 340 is tuned to the modulation frequency (by connecting a second input 344 of the phase-sensitive detector 340 to the frequency generator 110), and provides at an output 346 an output signal which is proportional to a component of the voltage signal at the modulation frequency. This output signal is passed through the low pass filter 350 and applied to a D.C. bias signal source in the form of a D.C. bias current driver circuit 400.

The D.C. bias current driver circuit 400 provides a D.C. bias signal in the form of a D.C. bias current which is added to the asymmetric envelope-modulated current signal supplied by the modulation current driver circuit 140 to drive the diode laser 200.

Figure 2:
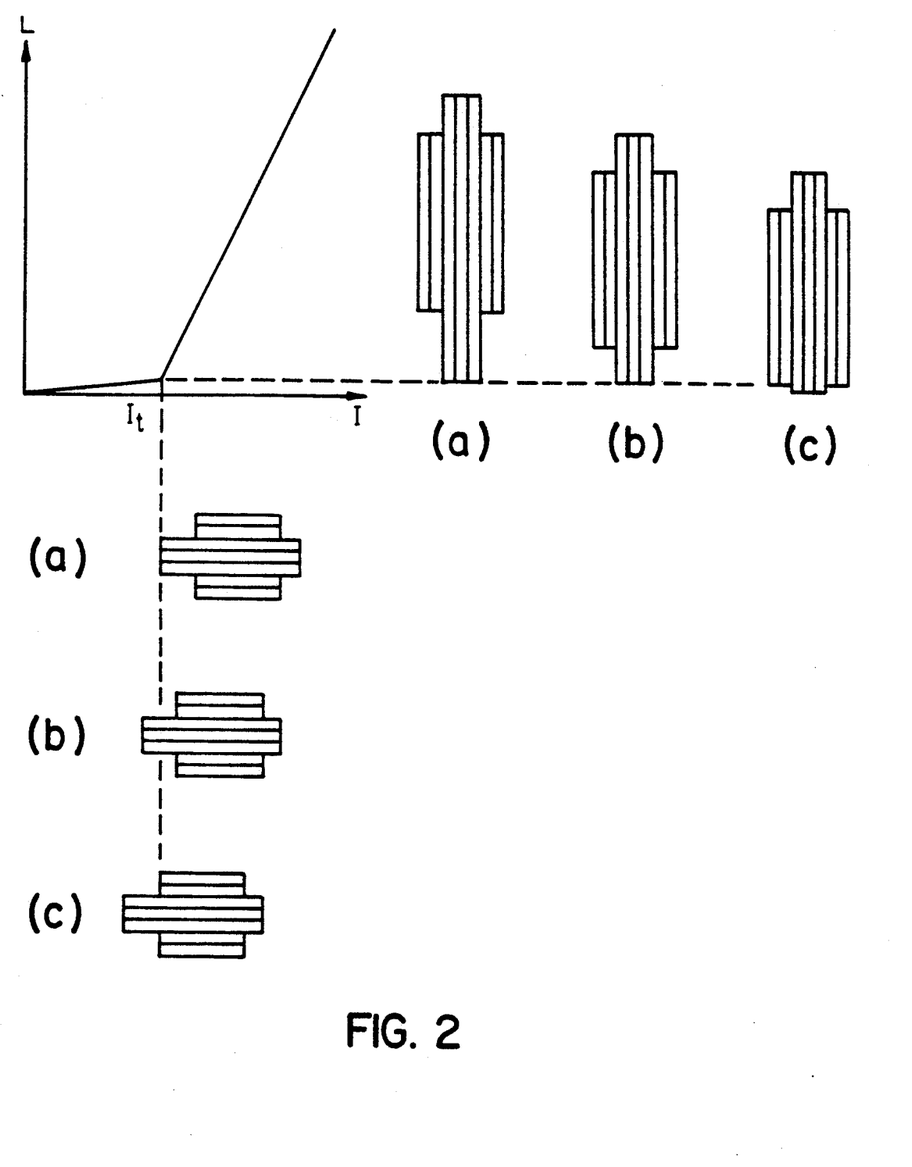
FIG. 2 is a plot of light output vs drive current for a typical semiconductor diode laser showing drive current waveforms used in the laser control circuit of FIG. 1 and light output waveforms corresponding to those drive current waveforms.

FIG. 2 is a plot of light output vs drive current for a typical semiconductor diode laser 200 showing three exemplary drive current waveforms and light output waveforms corresponding to those drive current waveforms. The drive current waveforms in cases (a), (b) and (c) are similar apart from small differences in D.C. bias current. All three drive current waveforms comprise the sum of an asymmetric envelope-modulated signal derived in the asymmetric envelope modulator 100 by applying symmetric envelope-modulation to the incoming data signal and clipping the resulting symmetric envelope-modulated signal at a maximum signal value, and a D.C. bias signal provided by the D.C. bias current driver circuit 400.

In case (b), the diode laser 200 is D.C. biased near the threshold so that the nonlinearity of the light output characteristic of the diode laser 200 cancels the asymmetry of the envelope modulation of the drive current waveform to provide a light output waveform having symmetric envelope modulation.

In case (a), the D.C. bias current of the diode laser 200 is increased so that the nonlinearity of the light output characteristic does not entirely cancel the asymmetry of the envelope modulation of the drive current waveform, and the light output waveform has envelope modulation with an asymmetry similar to the asymmetry of the envelope modulation of the corresponding drive current waveform.

In case (c), the D.C. bias current of the diode laser 200 is decreased so that the nonlinearity of the light output characteristic more than cancels the asymmetry of the envelope modulation of the drive current waveform, and the light output waveform has envelope modulation with an asymmetry opposite to the asymmetry of the envelope modulation of the corresponding drive current waveform.

Figure 3A:
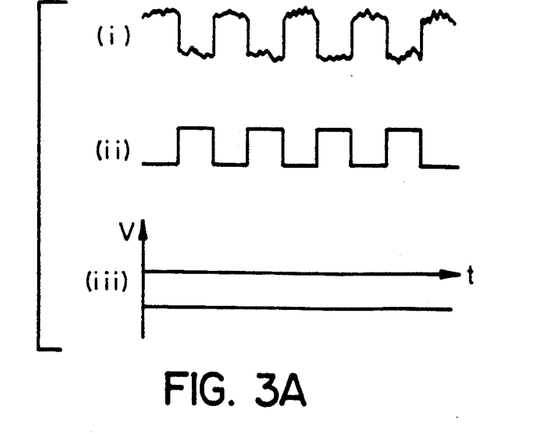
FIGS. 3a-3c a timing diagram showing further waveforms used in the operation of the laser control circuit of FIG. 1.
Figure 3B:
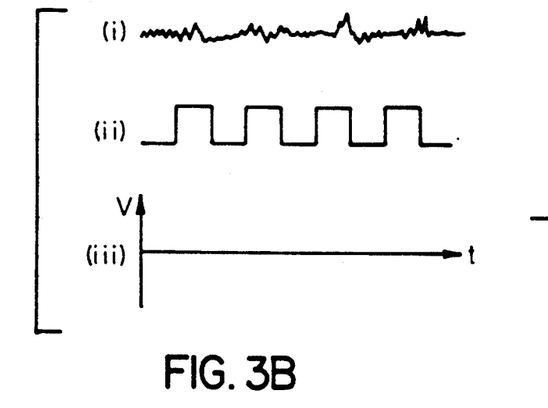
Figure 3C:
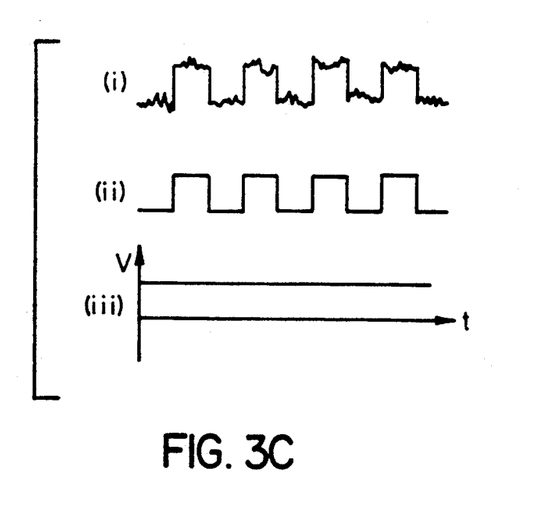

FIG. 3 is a timing diagram showing further waveforms used in the operation of the laser control circuit 1. For each of cases (a), (b) and (c) shown in FIG. 2, the waveforms at the inputs 342, 344 and output 346 of the phase-sensitive detector 340 are shown at (i), (ii) and (iii) respectively.

In case (a), the waveform at the first input 342 (see (i)) is a signal having an amplitude which is proportional to the magnitude of the asymmetry of the envelope modulation of the detected photocurrent and a phase which is opposite to the phase of the signal supplied by the frequency generator 110 to the second input 344 (see (ii)). The phase-sensitive detector 340 screens out any D.C. offset and noise at frequencies other than the modulation frequency that may be present in the waveform at the first input 342, and provides an output signal voltage proportional to the magnitude of the asymmetry of the envelope modulation of the detected photocurrent. The output voltage is negative because the waveform at the first input 342 is out of phase with the waveform supplied by the frequency generator 110 to the second input 344.

In case (b), there is no asymmetry in the modulation envelope of the detected photocurrent, so the waveform at the first input 342 has no component at the modulation frequency (see (i)). The phase-sensitive detector 340 screens out any D.C. offset and noise at frequencies other than the modulation frequency, and provides a zero voltage output signal.

In case (c), the waveform at the first input 342 (see (i)) is a signal having an amplitude which is proportional to the magnitude of the asymmetry of the envelope modulation of the detected photocurrent and which is in phase with the signal supplied by the frequency generator 110 to the second input 344 (see (ii)). The phase-sensitive detector 340 screens out any D.C. offset and noise at frequencies other than the modulation frequency that may be present in the waveform at the first input 342, and provides an output signal voltage proportional to the magnitude of the asymmetry of the envelope modulation of the detected photocurrent. The output voltage is positive because the waveform at the first input 342 is in phase with the waveform supplied by the frequency generator 110 to the second input 344.

Figure 4:
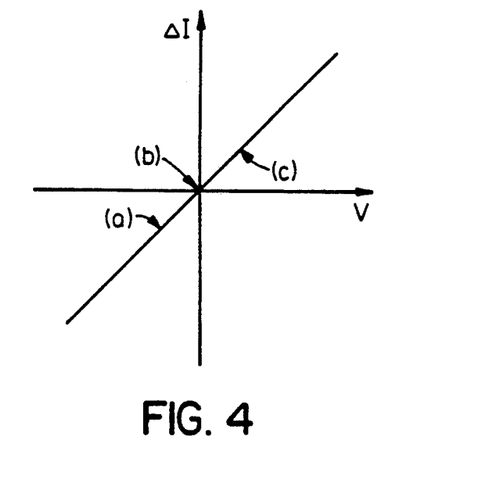
FIG. 4 is a plot showing control characteristics of a D.C. bias current driver circuit of the laser control circuit of FIG. 1.

FIG. 4 is a plot showing control characteristics of the D.C. bias current driver circuit 400. When the filtered output voltage of the phase-sensitive detector 340 is negative (corresponding to a negative-going asymmetry in the modulation envelope for the light emitted by the diode laser 200 as in case (a)), the D.C. bias current driver circuit 400 responds by decreasing the D.C. bias current supplied to the diode laser 200. When the filtered output voltage of the phase-sensitive detector 340 is zero (corresponding to a symmetric modulation envelope for the light emitted by the diode laser as in case (b)), the D.C. bias current driver circuit 400 responds by not changing the D.C. bias current supplied to the diode laser 200. When the filtered output voltage of the phase-sensitive detector 340 is positive (corresponding to a positive-going asymmetry in the modulation envelope for the light emitted by the diode laser 200 as in case (c)), the D.C. bias current driver circuit 400 responds by increasing the D.C. bias current supplied to the diode laser 200. Thus, in each case, the D.C. bias current driver 400 responds to the output of the tuned optical receiver 300 by adjusting the D.C. bias current supplied to the diode laser 200 so as to reduce the asymmetry of the modulation envelope of the light emitted by the laser diode 200 and to thereby reduce the output of the tuned optical receiver 300.

Thus, the D.C. bias current driver circuit 400 provides and maintains a D.C. bias current such that bottom clipping of the modulation envelope due to the nonlinear light output characteristic of the diode laser 200 is equal to the top-clipping provided by the top-clipping circuit 130. The extinction ratio and turn on time of the diode laser 200 are controlled as desired by adjusting the degree of top-clipping provided by the top-clipping circuit 130.

Because the laser control circuit 1 controls the laser diode 200 so as to minimize asymmetries in the envelope-modulation of the light emitted by the diode laser 200, the level of the component at the modulation frequency in the optical signal emitted by the diode laser 200 is also minimized. Thus, the signal component at the modulation frequency is less likely to saturate high impedance optical receivers than the relatively strong pilot tones used by some known laser control circuits.

Figure 5:
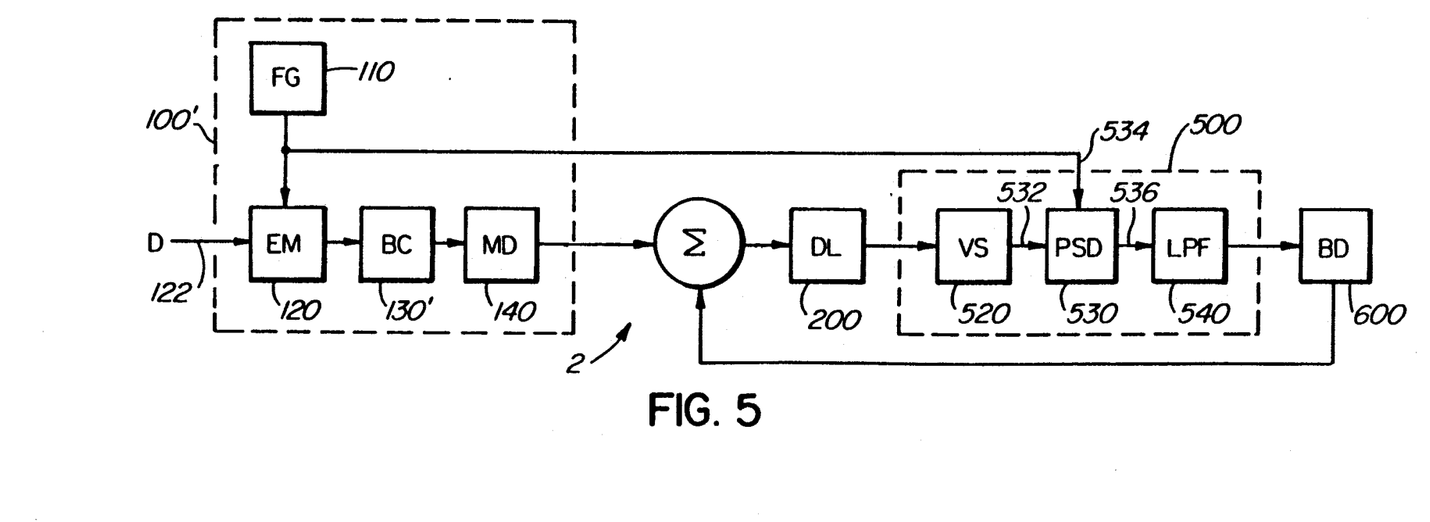
FIG. 5 is a block schematic diagram of a semiconductor diode laser control circuit according to a second embodiment of the invention.

FIG. 5 is a block schematic diagram of a semiconductor diode laser control circuit 2 according to a second embodiment of the invention.

The laser control circuit 2 comprises an asymmetric envelope modulator 100' which is essentially the same as the asymmetric envelope modulator 100 of the laser control circuit 1 described above, except that the top-clipping circuit 130 is replaced by a bottom-clipping circuit 130'. The bottom-clipping circuit 130' clips a symmetric envelope-modulated signal provided by the symmetric envelope modulator 120 at a minimum signal value to derive an asymmetric envelope-modulated signal. As in the modulator 100, the asymmetric envelope-modulated signal is fed to a modulation current driver circuit 140 which provides current drive and impedance matching as needed to drive a semiconductor diode laser 200 with the asymmetric envelope-modulated signal.

The laser control circuit 2 further comprises a monitor in the form of a voltage monitor circuit 500. The voltage monitor circuit 500 comprises a voltage sensing circuit 520, a phase-sensitive detector 530 and a low pass filter 540. The voltage sensing circuit 520 is connected across the diode laser 200 to sense the voltage across the diode laser 200 and apply that voltage to a first input 532 of the phase-sensitive detector 530. The phase-sensitive detector 530 is tuned to the modulation frequency (by connecting a second input 534 of the phase-sensitive detector 530 to the frequency generator 110), and provides at an output 536 an output signal which is proportional to a component of the sensed voltage signal at the modulation frequency. This output signal is passed through the low pass filter 540 and applied to a D.C. bias signal source in the form of a D.C. bias driver circuit 600.

Figure 6:
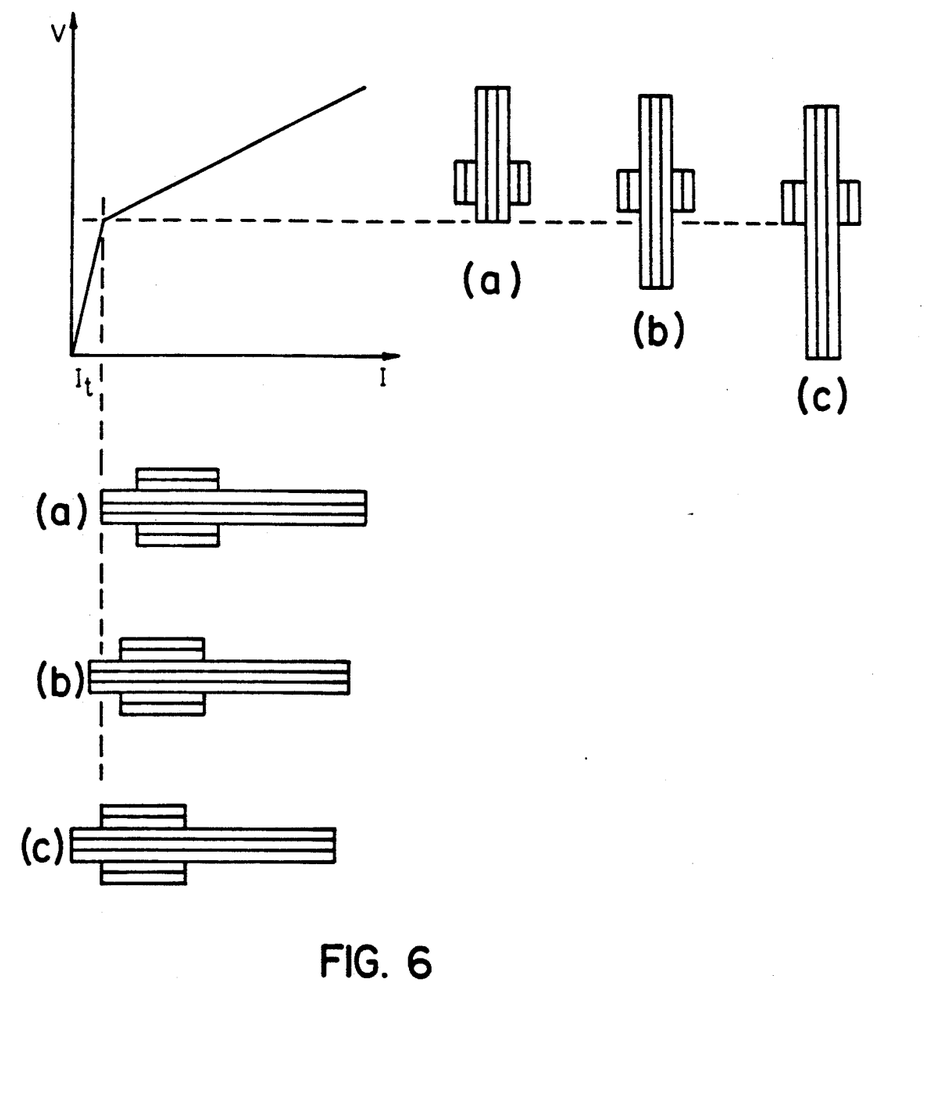
FIG. 6 is a plot of voltage vs drive current for a typical semiconductor diode laser showing drive current waveforms used in the laser control circuit of FIG. 5 and voltage waveforms corresponding to those drive current waveforms.

FIG. 6 is a plot of voltage vs drive current for a typical semiconductor diode laser 200 showing drive current waveforms used in the laser control circuit 2 and voltage waveforms corresponding to those drive current waveforms. The drive current waveforms in cases (a), (b) and (c) are similar apart from small differences in D.C. bias current.

In case (b), the diode laser 200 is D.C. biased near the threshold so that the nonlinearity of the voltage characteristic of the diode laser 200 cancels the asymmetry of the envelope modulation of the drive current waveform to provide a light output waveform having symmetric envelope modulation.

In case (a), the D.C. bias current of the diode laser 200 is increased so that the nonlinearity of the light output characteristic does not entirely cancel the asymmetry of the envelope modulation of the drive current waveform, and the light output waveform has envelope modulation with an asymmetry similar to the asymmetry of the envelope modulation of the corresponding drive current waveform.

In case (c), the D.C. bias current of the diode laser 200 is decreased so that the nonlinearity of the light output characteristic more than cancels the asymmetry of the envelope modulation of the drive current waveform, and the light output waveform has envelope modulation with an asymmetry opposite to the asymmetry of the envelope modulation of the corresponding drive current waveform.

Figure 7A:
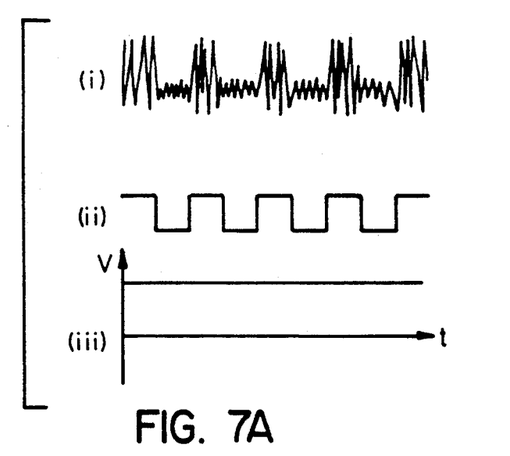
FIGS. 7a-7c are a timing diagram showing further waveforms used in the operation of the laser control circuit of FIG. 5.
Figure 7B:
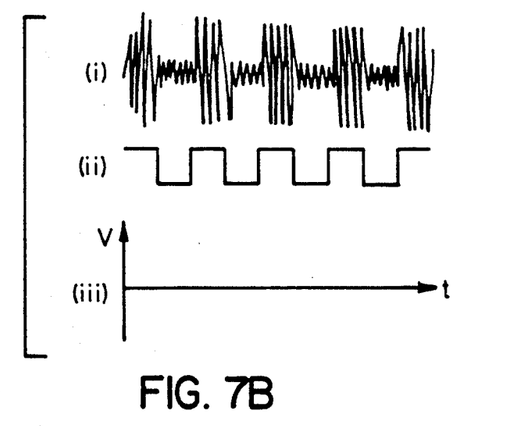
Figure 7C:
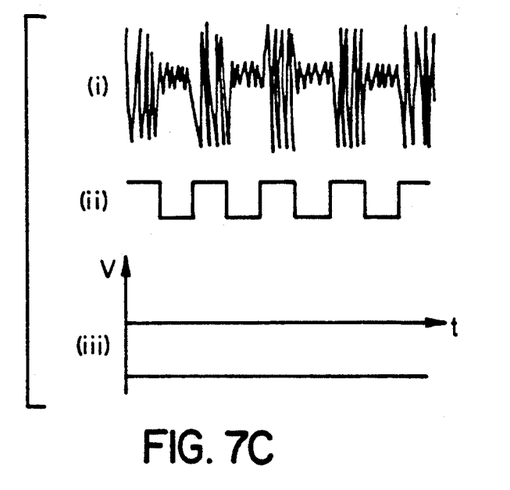

FIG. 7 is a timing diagram showing further waveforms used in the operation of the laser control circuit 2. For each of cases (a), (b) and (c) shown in FIG. 5, the waveforms at the inputs 532, 534 and output 536 of the phase-sensitive detector 530 are shown at (i), (ii) and (iii) respectively.

In case (a), the waveform at the first input 342 (see (i)) is an asymmetric envelope-modulated signal having an asymmetry which is in phase with the signal supplied by the frequency generator 110 to the second input 534 (see (ii)). The phase-sensitive detector 530 screens out any D.C. offset and signal components at frequencies other than the modulation frequency which are present in the waveform at the first input 532, and provides an output signal voltage proportional to the magnitude of the asymmetry of the envelope modulation of the sensed voltage. The output voltage is positive because the asymmetric envelope modulation of the waveform at the first input 532 is in phase with the waveform supplied by the frequency generator 110 to the second input 534.

In case (b), there is no asymmetry in the modulation envelope of the sensed voltage (see (i)). The phase-sensitive detector 530 screens out any D.C. offset and signal components at frequencies other than the modulation frequency, and provides a zero voltage output signal.

In case (c), the waveform at the first input 532 (see (i)) is an asymmetric envelope-modulated signal having an asymmetry which is out of phase with the signal supplied by the frequency generator 110 to the second input 534 (see (ii)). The phase-sensitive detector 530 screens out any D.C. offset and signal components at frequencies other than the modulation frequency in the waveform at the first input 532, and provides an output signal voltage proportional to the magnitude of the asymmetry of the envelope modulation of the detected photocurrent. The output voltage is negative because the waveform at the first input 532 is out of phase with the waveform supplied by the frequency generator 110 to the second input 534.

Figure 8:
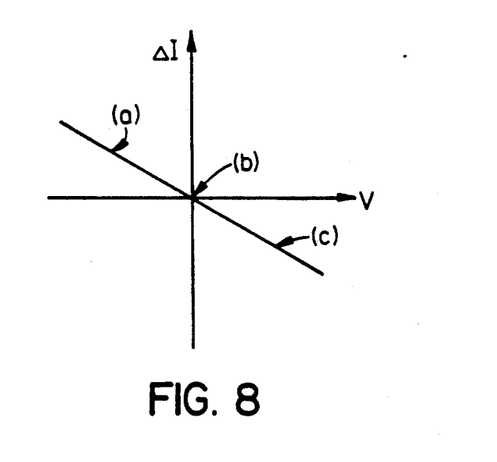
FIG. 8 is a plot showing control characteristics of a D.C. bias current driver circuit of the laser control circuit of FIG. 5.

FIG. 8 is a plot showing control characteristics of the D.C. bias current driver circuit 600. When the filtered output voltage of the phase-sensitive detector 530 is positive (corresponding to a positive-going asymmetry in the modulation envelope for sensed voltage across the diode laser 200 as in case (a)), the D.C. bias current driver circuit 600 responds by decreasing the D.C. bias current supplied to the diode laser 200. When the filtered output voltage of the phase-sensitive detector 530 is zero (corresponding to a symmetric modulation envelope for the sensed voltage across the diode laser as in case (b)), the D.C. bias current driver circuit 600 responds by not changing the D.C. bias current supplied to the diode laser 200. When the filtered output voltage of the phase-sensitive detector 530 is negative (corresponding to a negative-going asymmetry in the modulation envelope for the sensed voltage across the diode laser 200 as in case (c)), the D.C. bias current driver circuit 600 responds by increasing the D.C. bias current supplied to the diode laser 200. Thus, in each case, the D.C. bias current driver 600 responds to the output of the voltage monitor circuit 500 by adjusting the D.C. bias current supplied to the diode laser 20 so as to reduce the asymmetry of the modulation envelope of the sensed voltage across the laser diode 200 and to thereby reduce the output of the voltage monitor circuit 500.

Thus, the D.C. bias current driver circuit 600 provides and maintains a D.C. bias current such that top-clipping of the modulation envelope due to the nonlinear voltage characteristic of the diode laser 200 is equal to the bottom clipping provided by the bottom-clipping circuit 130'. The extinction ratio and turn on time of the diode laser 200 are controlled as desired by adjusting the degree of bottom clipping provided by the bottom-clipping circuit 130'.

The laser control circuit 2 requires no photodetector 320 and therefore may be cheaper to implement than the laser control circuit 1 described above. However, as the nonlinearity of the voltage characteristic of the diode laser 200 is generally less sharp than the non-linearity of the light output characteristic, the laser control circuit 2 may not track variations in threshold current as quickly as the laser control circuit 1.

Modifications to the laser control circuits 1, 2 may be made without departing from the invention.

For example, the description of the first laser control circuit 1 assumes the use of a low speed photodetector 320 which detects the envelope modulation, but detects very little or none of the data signal. A higher speed photodetector could be used provided that the phase-sensitive detector 340 is able to screen signal at the data frequency and provide an output indicative of the signal magnitude at the frequency of envelope modulation.

Conversely, the description of the second laser control circuit 2 assumes the use of a high speed voltage sensing circuit 520 which detects signals at both the frequency of envelope modulation and the data frequency. This could be replaced by a lower speed voltage sensing circuit which detects the signal at the frequency of envelope modulation, but little or no signal at the data frequency. Indeed, such a lower speed voltage sensing circuit would likely be easier and cheaper to implement.

The depth of envelope modulation shown in FIGS. 2, 3, 6 and 7 is exaggerated for the sake of illustration. Practical modulation depths are of the order of 5% to 10% of the data signal magnitude.

Figure 9A:
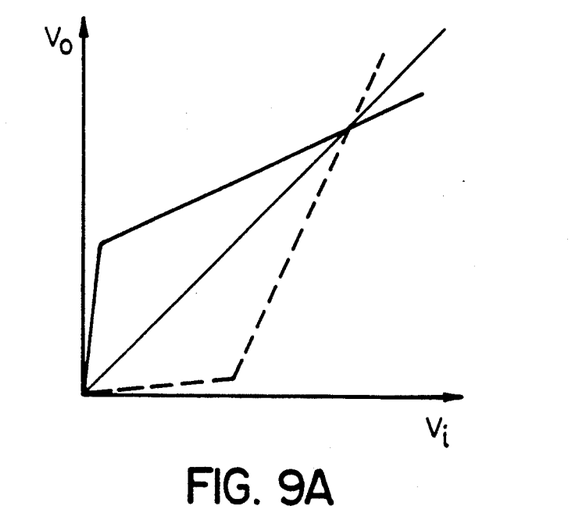
FIGS. 9a and 9b are plots showing the relationship of clipping characteristics to laser characteristics for refined implementations of the laser control circuits of FIGS. 1 and 5 respectively.
Figure 9B:
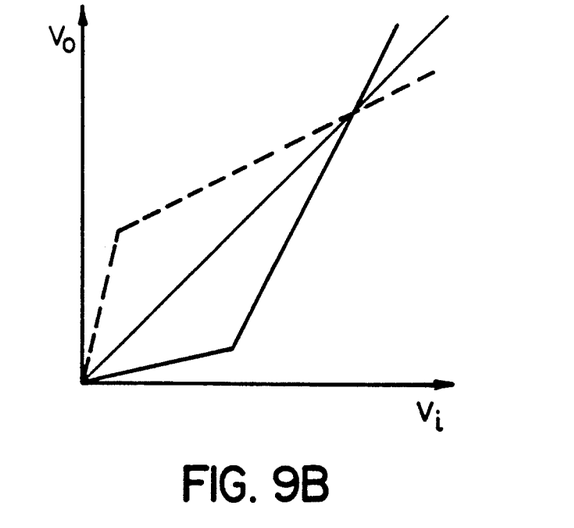

While standard top-clipping circuits 130 and bottom-clipping circuits 130' are adequate for proper operation of the laser control circuits 1, 2 respectively, improved operation can be obtained by tailoring the clipping characteristics to the monitored nonlinear characteristic of the laser 200 to be controlled. In particular, the top-clipping circuit 130 is optimal if it has a clipping characteristic shown in FIG. 9a which is a mirror image of the laser light output characteristic shown in FIG. 2 (and shown dotted in FIG. 9a). The bottom-clipping circuit 130' is optimal if it has a clipping characteristic shown in FIG. 9b which is a mirror image of the laser voltage characteristic shown in FIG. 6 (and shown dotted in FIG. 9b). Such clipping circuits could be realized as diode shaping circuits, including temperature compensation.

These and other variations are within the scope of the invention as defined by the following claims.

What is claimed is:

1. A method for controlling a D.C. bias point of a semiconductor diode laser, the method comprising:
   applying asymmetric envelope modulation at a modulation frequency to an input signal to derive an asymmetric envelope-modulated signal;
   adding a D.C. bias signal to the asymmetric envelope-modulated signal to derive a laser drive signal; and
   driving a semiconductor diode laser with the laser drive signal, while;
      monitoring at the modulation frequency a characteristic of the laser which is nonlinear with respect to the laser drive signal; and
      controlling the D.C. bias signal in response to the monitored characteristic so as to reduce the monitored characteristic at the modulation frequency.

2. A method as defined in claim 1, wherein the step of applying asymmetric envelope modulation to the input signal comprises:
   applying symmetric envelope modulation to the input signal to derive a symmetric envelope-modulated signal; and
   clipping the symmetric envelope-modulated signal to derive the asymmetric envelope-modulated signal.

3. A method as defined in claim 2, further comprising controlling the extinction ratio of the laser by controlling the clipping of the symmetric envelope-modulated signal.

4. A method as defined in claim 2, wherein the step of clipping the symmetric envelope-modulated signal comprises clipping the symmetric envelope-modulated signal according to a clipping characteristic which is a mirror image of the nonlinear characteristic of the laser.

5. A method as defined in claim 1, wherein:
   the steps of applying asymmetric envelope modulation and adding a D.C. bias signal provide a laser drive signal having a modulation envelope characterized by variations in maximum drive current of greater magnitude than variations in minimum drive current; and
   the step of monitoring at the modulation frequency a characteristic of the laser which is nonlinear with respect to the laser drive signal comprises monitoring a component at the modulation frequency of a voltage across a junction of the diode laser.

6. A method as defined in claim 5, wherein the step of applying asymmetric envelope modulation comprises:
   applying symmetric envelope modulation to the input signal to derive a symmetric envelope-modulated signal; and
   clipping the symmetric envelope-modulated signal at a minimum signal level to derive the asymmetric envelope-modulated signal.

7. A method as defined in claim 6, wherein the step of clipping the symmetric envelope-modulated signal comprises clipping the symmetric envelope-modulated signal according to a clipping characteristic which is a mirror image of the nonlinear voltage characteristic of the laser.

8. A method as defined in claim 1, wherein:
   the steps of applying asymmetric envelope modulation and adding a D.C. bias signal provide a laser drive signal having a modulation envelope characterized by variations in minimum drive current of greater magnitude than variations in maximum drive current; and the step of monitoring at the modulation frequency a characteristic of the laser which is nonlinear with respect to the laser drive signal comprises monitoring a component at the modulation frequency of light output of the diode laser.

9. A method as defined in claim 8, wherein the step of applying asymmetric envelope modulation comprises:
   applying symmetric envelope modulation to the ID input signal to derive a symmetric envelope-modulated signal; and
   clipping the symmetric envelope-modulated signal at a maximum signal level to derive the asymmetric envelope-modulated signal.

10. A method as defined in claim 9, wherein the step of clipping the symmetric envelope-modulated signal comprises clipping the symmetric envelope-modulated signal according to a clipping characteristic which is a mirror image of the nonlinear light output characteristic of the laser.

11. A method as defined in claim 8, wherein the step of monitoring light output of the diode laser comprises monitoring light output from one of two light emitting facets of the diode laser.

12. A method for controlling a D.C. bias point of a nonlinear device, the method comprising:
   applying asymmetric envelope modulation at a modulation frequency to an input signal to derive an asymmetric envelope-modulated signal;
   adding a D.C. bias signal to the asymmetric envelope-modulated signal to derive a drive signal; and
   driving a nonlinear device with the drive signal, while;
      monitoring at the modulation frequency a characteristic of the nonlinear device which is nonlinear with respect to the drive signal; and controlling the D.C. bias signal in response to the monitored characteristic so as to reduce the monitored characteristic at the modulation frequency.

13. Apparatus for controlling a D.C. bias point of a nonlinear device, the apparatus comprising:
- an asymmetric envelope modulator for applying asymmetric envelope modulation at a modulation frequency to an input signal to derive an asymmetric envelope-modulated signal;
- a D.C. bias signal source for adding a D.C. bias signal to the asymmetric envelope-modulated signal to derive a drive signal for driving the nonlinear device; and
- a monitor for monitoring at the modulation frequency a characteristic of the nonlinear device which is nonlinear with respect to the drive signal;
- the D.C. bias signal source being responsive to the monitored characteristic at the modulation frequency to adjust the D.C. bias signal so as to reduce the monitored characteristic at the modulation frequency.

14. Apparatus as defined in claim 13, wherein the asymmetric envelope modulator comprises:
- a symmetric envelope modulator for applying symmetric envelope modulation to the input signal to derive a symmetric envelope-modulated signal; and
- a clipper for clipping the symmetric envelope-modulated signal to derive the asymmetric envelope-modulated signal.

15. Apparatus as defined in claim 14, wherein the clipper has a clipping characteristic which is a mirror image of the nonlinear characteristic of the device.

16. Apparatus as defined in claim 14 for controlling a D.C. bias point of a semiconductor diode laser, wherein:
- the clipper clips the symmetric envelope-modulated signal at a minimum signal value to derive the asymmetric envelope-modulated signal; and
- the monitor comprises a voltage monitor tuned to the modulation frequency to monitor a component of a voltage across the laser at the modulation frequency.

17. Apparatus as defined in claim 16, wherein the clipper has a clipping characteristic which is a mirror image of the laser voltage characteristic.

18. Apparatus as defined in claim 14, wherein the voltage monitor comprises:
- a voltage sensing circuit for sensing the voltage across the laser; and
- a phase sensitive detector connected to the voltage sensing circuit and tuned to the modulation frequency to detect a component of the voltage across the laser at the modulation frequency.

19. Apparatus as defined in claim 14 for controlling a D.C. bias point of a semiconductor diode laser, wherein:
- the clipper clips the symmetric envelope-modulated signal at a maximum signal value to derive the asymmetric envelope-modulated signal; and
- the monitor comprises an optical receiver tuned to the modulation frequency to monitor a component of light output from the laser at the modulation frequency.

20. Apparatus as defined in claim 19, wherein the clipper has a clipping characteristic which is a mirror image of the laser light output characteristic.

21. Apparatus as defined in claim 19, wherein the optical receiver comprises:
- a photodetector positioned to receive light from the laser;
- a bias circuit for biasing to the photodetector to provide a photocurrent indicative of the light received from the laser;
- a current-to-voltage converter for converting the photocurrent to a voltage signal; and
- a phase sensitive detector connected to the current-to-voltage converter and tuned to the modulation frequency to detect a component of the voltage signal at the modulation frequency.

* * * * *